US012588285B2

(12) United States Patent
Ai et al.

(10) Patent No.: US 12,588,285 B2
(45) Date of Patent: Mar. 24, 2026

(54) DISPLAY PANEL AND MOBILE TERMINAL

(71) Applicant: Wuhan China Star Optoelectronics Technology Co., Ltd., Wuhan (CN)

(72) Inventors: Fei Ai, Wuhan (CN); Chengzhi Luo, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/910,800

(22) PCT Filed: Aug. 30, 2022

(86) PCT No.: PCT/CN2022/115931
§ 371 (c)(1),
(2) Date: Sep. 10, 2022

(87) PCT Pub. No.: WO2024/007434
PCT Pub. Date: Jan. 11, 2024

(65) Prior Publication Data
US 2025/0133826 A1      Apr. 24, 2025

(30) Foreign Application Priority Data
Jul. 8, 2022      (CN) .......................... 202210806138.5

(51) Int. Cl.
*H10D 86/40*      (2025.01)
*G02F 1/1333*      (2006.01)
(52) U.S. Cl.
CPC ....... *H10D 86/451* (2025.01); *G02F 1/13338* (2013.01); *H10D 86/441* (2025.01)

(58) Field of Classification Search
CPC ............... H10D 86/451; H10D 86/441; H10D 30/6732; G02F 1/13338
See application file for complete search history.

(56) References Cited

U.S. PATENT DOCUMENTS

| | | | |
|---|---|---|---|
| 5,907,376 A | 5/1999 | Shimada et al. | |
| 9,759,941 B2 * | 9/2017 | Yang ................... | G02F 1/13338 |

(Continued)

FOREIGN PATENT DOCUMENTS

| | | |
|---|---|---|
| CN | 105702623 A | 6/2016 |
| CN | 105895581 A | 8/2016 |

(Continued)

OTHER PUBLICATIONS

International Search Report in International application No. PCT/CN2022/115931,mailed on Dec. 16, 2022.

(Continued)

*Primary Examiner* — Peter M Albrecht
(74) *Attorney, Agent, or Firm* — Nathan & Associates Patent Agents Ltd.; Menachem Nathan

(57)      ABSTRACT
The present disclosure provides a display panel and a mobile terminal, the display panel includes a substrate and a thin film transistor layer, the thin film transistor layer including a semiconductor layer, an insulating layer and a first metal layer, the insulating layer being disposed on the substrate and the semiconductor layer and covering the semiconductor layer, the first metal layer being disposed on the insulating layer, the insulating layer including at least one via hole, the first metal layer being connected to the semiconductor layer through the via hole, and an included angle between a sidewall of the via hole and a bottom surface of the insulating layer being greater than or equal to 85 degrees and less than or equal to 90 degrees.

20 Claims, 8 Drawing Sheets

(56)                   References Cited

U.S. PATENT DOCUMENTS

| | | | |
|---|---|---|---|
| 2005/0224799 A1 * | 10/2005 | Yamamoto | H10D 30/6757 |
| | | | 257/66 |
| 2017/0045995 A1 * | 2/2017 | Zhao | G02F 1/13338 |
| 2017/0365623 A1 * | 12/2017 | Zhang | H10D 30/6732 |
| 2019/0086701 A1 | 3/2019 | Xie et al. | |
| 2022/0028986 A1 * | 1/2022 | Zhang | H10D 86/451 |
| 2022/0140048 A1 | 5/2022 | Zhang et al. | |

FOREIGN PATENT DOCUMENTS

| | | |
|---|---|---|
| CN | 108363252 A | 8/2018 |
| CN | 113871401 A | 12/2021 |
| CN | 114460772 A | 5/2022 |
| CN | 114594876 A | 6/2022 |
| CN | 114649349 A | 6/2022 |
| CN | 114678327 A | 6/2022 |

OTHER PUBLICATIONS

Written Opinion of the International Search Authority in International application No. PCT/CN2022/115931,mailed on Dec. 16, 2022.
Chinese Office Action issued in corresponding Chinese Patent Application No. 202210806138.5 dated May 30, 2025, pp. 1-8.

* cited by examiner

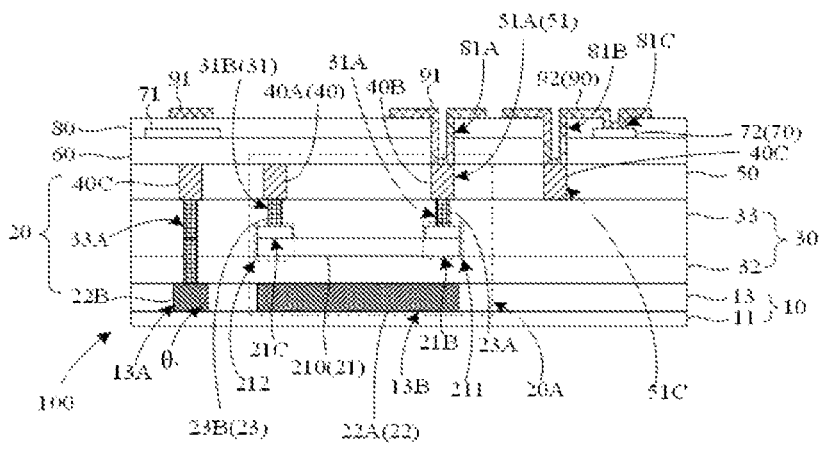

FIG. 9

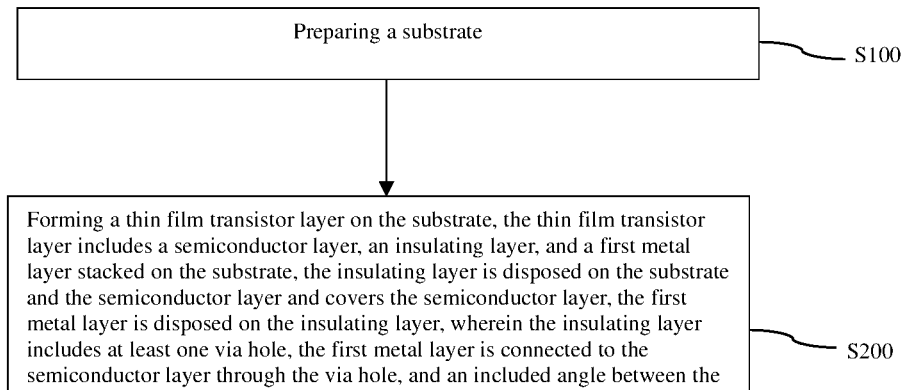

| Preparing a substrate | S100 |

Forming a thin film transistor layer on the substrate, the thin film transistor layer includes a semiconductor layer, an insulating layer, and a first metal layer stacked on the substrate, the insulating layer is disposed on the substrate and the semiconductor layer and covers the semiconductor layer, the first metal layer is disposed on the insulating layer, wherein the insulating layer includes at least one via hole, the first metal layer is connected to the semiconductor layer through the via hole, and an included angle between the sidewall of the via hole and the bottom surface of the insulating layer is greater than or equal to 85 degrees and less than or equal to 90 degrees — S200

FIG. 10

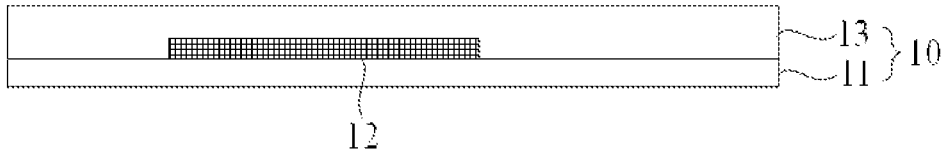

FIG. 11A

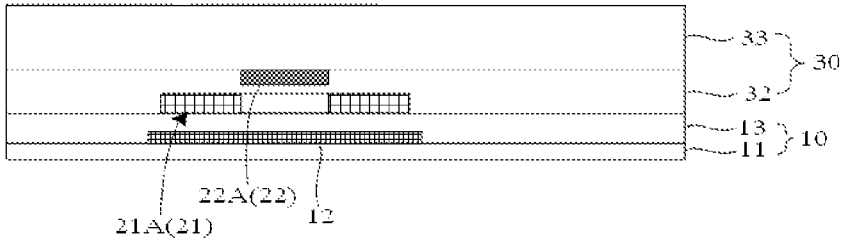

FIG. 11B

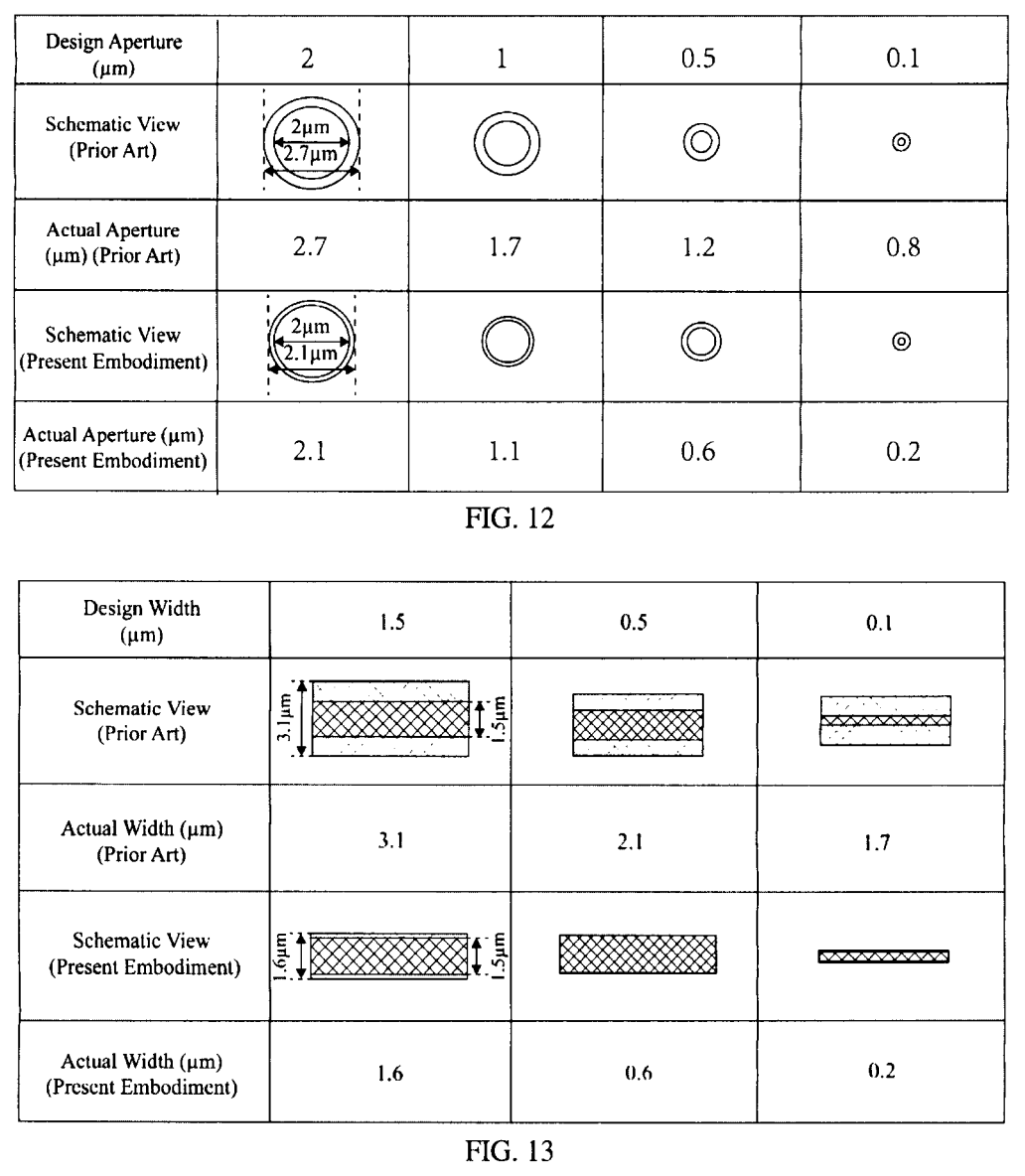

| Design Aperture (µm) | 2 | 1 | 0.5 | 0.1 |
|---|---|---|---|---|
| Schematic View (Prior Art) | 2µm 2.7µm | ◎ | ◎ | ◎ |
| Actual Aperture (µm) (Prior Art) | 2.7 | 1.7 | 1.2 | 0.8 |
| Schematic View (Present Embodiment) | 2µm 2.1µm | ◯ | ◎ | ◎ |
| Actual Aperture (µm) (Present Embodiment) | 2.1 | 1.1 | 0.6 | 0.2 |

FIG. 12

| Design Width (µm) | 1.5 | 0.5 | 0.1 |
|---|---|---|---|
| Schematic View (Prior Art) | 3.1µm 1.5µm | | |
| Actual Width (µm) (Prior Art) | 3.1 | 2.1 | 1.7 |
| Schematic View (Present Embodiment) | 1.6µm 1.5µm | | |
| Actual Width (µm) (Present Embodiment) | 1.6 | 0.6 | 0.2 |

FIG. 13

DISPLAY PANEL AND MOBILE TERMINAL

FIELD OF INVENTION

The present disclosure relates to a field of display technology, in particular to a display panel and a mobile terminal.

BACKGROUND OF INVENTION

With a continuous development of display technology, consumers have increasing demands on characteristics of display panels, such as narrow bezel, high aperture ratio, high brightness, high resolution, and the like. Among them, particularly in the emerging display technology fields, such as VR (Virtual Reality) display/AR (Augmented Reality) display, panel system integration, and the like, array substrates are required to have ultra-high pixel density (Pixels Per Inch (PPI)) and sub-micron-scale device size.

In the conventional process of the array substrate, via holes are usually formed in an insulating layer to electrically connect conductive parts located in different film layers, wherein a plurality of conductive parts located in the same film layer need to be electrically connected through conductive parts located in other different layers respectively, resulting in different depths of the via holes to be etched and the number of film layers that the via holes pass through: in order to make the array substrate have ultra-high pixel density and sub-micron-scale device size, it is required that the line width, the line space, the size of the via holes, and the like of the array device are reduced as much as possible, and that the thickness of the metal wire and the depth of the via hole are required to be increased as much as possible.

However, due to the limitation of the exposure apparatus and the etching process, the taper angle (taper) of the via hole is relatively small, and both sides of the via hole are arc-shaped, so that the area occupied by the opening on the insulating layer is relatively large, and the metal wire needs to cover the via hole completely, which causes the line width of the metal wire on the via hole to be increased, which is not conducive to the layout of wires in the case of high PPI.

SUMMARY OF INVENTION

Technical Problem

An embodiment of the present disclosure provides a display panel to alleviate deficiencies in the related art.

Technical Solution

To realize the above functions, the technical solution provided in the embodiments of the present disclosure is as follows:

An embodiment of the present disclosure provides a display panel including a substrate and a thin film transistor layer disposed on the substrate, the thin film transistor layer comprises a semiconductor layer, an insulating layer, and a first metal layer stacked on the substrate, the insulating layer is disposed on the substrate and the semiconductor layer and covers the semiconductor layer, and the first metal layer is disposed on the insulating layer:

wherein the insulating layer comprises at least one via hole, the first metal layer is connected to the semiconductor layer through the via hole, and an included angle between a sidewall of the via hole and a bottom surface of the insulating layer is greater than or equal to 85 degrees and less than or equal to 90 degrees.

In a display panel provided in an embodiment of the present disclosure, the via hole comprises a first opening on a side away from the substrate and a second opening on a side close to the substrate:

Wherein a ratio of a width of the first opening to a width of the second opening is greater than or equal to 0.9 and less than or equal to 1.1.

In a display panel provided in an embodiment of the present disclosure, the substrate comprises a base and a buffer layer disposed on the base, and a thickness of the insulating layer is greater than twice a thickness of the buffer layer.

In the display panel provided in the embodiment of the present disclosure, the display panel further comprises a conductive filling portion disposed in the via hole, and the first metal layer is connected to the semiconductor layer through the conductive filling portion.

In the display panel provided in the embodiment of the present disclosure, a resistivity of the conductive filling portion is less than $5.48 \times 10^{-6}$ $\Omega \cdot m$.

In the display panel provided by an embodiment of the present disclosure, an orthographic projection of the first metal layer on the base covers an orthographic projection of the conductive filling portion on the base.

In a display panel provided in an embodiment of the present disclosure, the display panel further comprises a spacing layer on a side of the insulating layer away from the substrate, the spacing layer comprises at least one open slot penetrating through the spacing layer, and the open slot is provided in communication with the via hole:

wherein the first metal layer is disposed in the open slot, and the included angle between a sidewall of the open slot and a bottom surface of the spacing layer is greater than or equal to 85 degrees and less than or equal to 90 degrees.

In the display panel provided in the embodiment of the present disclosure, a ratio of a depth of the open slot to a width of the open slot is greater than or equal to 0.2 and less than or equal to 1.

In the display panel provided in the embodiment of the present disclosure, the display panel further comprises a second metal layer:

the thin film transistor layer comprises a plurality of thin film transistors, the first metal layer comprises a source and a drain of the thin film transistor, the semiconductor layer comprises an active layer of the thin film transistor, and the second metal layer comprises a gate of the thin film transistor;

the insulating layer comprises a plurality of via holes, the plurality of via holes comprise a first via hole and a second via hole located above the active layer, the drain is connected to the active layer through the first via hole, and the source is connected to the active layer through the second via hole.

In the display panel provided in the embodiment of the present disclosure, the display panel further comprises a conductive filling portion, the conductive filling portion comprises a first filling portion disposed in the first via hole and a second filling portion disposed in the second via hole, the drain is connected to the active layer through the first filling portion, and the source is connected to the active layer through the second filling portion.

In a display panel provided in an embodiment of the present disclosure, the spacing layer comprises a plurality of open slots, the plurality of open slots comprises a third open slot in communication with the first via hole and a second open slot in communication with the second via hole:

wherein the drain is disposed in the third open slot and the source is disposed in the second open slot.

In a display panel provided in an embodiment of the present disclosure, the semiconductor layer is located between the gate and the substrate, the insulating layer comprises a gate insulating layer disposed between the semiconductor layer and the gate, and an interlayer insulating layer disposed on a side of the gate insulating layer away from the gate:

both the first via hole and the second via hole pass through the interlayer insulating layer and the gate insulating layer;

wherein the substrate comprises a base and a buffer layer disposed on the base, and a thickness of the interlayer insulating layer is greater than twice a thickness of the buffer layer.

In a display panel provided in an embodiment of the present disclosure, the gate is located between the semiconductor layer and the substrate, the insulating layer comprises an interlayer insulating layer disposed between the semiconductor layer and the first metal layer, and a gate insulating layer is disposed on a side of the semiconductor layer away from the interlayer insulating layer:

both the first via hole and the second via hole pass through the interlayer insulating layer;

wherein the substrate comprises a base and a buffer layer disposed on the base, and a thickness of the interlayer insulating layer is greater than twice a thickness of the buffer layer.

In the display panel provided in the embodiment of the present disclosure, the display panel further comprises a flat layer, a second electrode layer, a passivation layer, and a first electrode layer stacked on the spacing layer:

a second connection via hole penetrating through the flat layer and the passivation layer is provided in the display panel, and the second connection via hole is communicated with the third open slot;

the first electrode layer comprises a first electrode connected to the drain through the second connection via hole;

wherein an included angle between a sidewall of the second connection via hole and a bottom surface of the flat layer is greater than or equal to 85 degrees and less than or equal to 90 degrees.

In the display panel provided in the embodiment of the present disclosure, a first connection via hole penetrating through the flat layer and the passivation layer and a third connection via hole penetrating through the passivation layer are provided in the display panel:

the plurality of open slots comprise a first open slot in communication with the first connection via hole, the first connection via hole is in communication with the first open slot, the first metal layer comprises a first signal line disposed in the first open slot, the second electrode layer comprises a touch electrode, the first electrode layer comprises a bridge section, one end of the bridge section is connected with the first signal line through the first connection via hole, and another end of the bridge section is connected with the touch electrode through the third connection via hole:

wherein an included angle between a sidewall of the first connection via hole and the bottom surface of the flat layer is greater than or equal to 85 degrees and less than or equal to 90 degrees, and an included angle between a sidewall of the third connection via hole and a bottom surface of the passivation layer is greater than or equal to 85 degrees and less than or equal to 90 degrees.

In the display panel provided in the embodiment of the present disclosure, the second metal layer further comprises a second signal line spaced apart from the gate, the first metal layer comprises a third signal line disposed opposite to the second signal line, the thin film transistor layer comprises a third via hole located above the second signal line, the conductive filling portion comprises a third filling portion disposed in the third via hole, and the plurality of open slots comprises a fourth open slot in communication with the third via hole;

wherein the third signal line is disposed in the fourth open slot and is connected to the second signal line through the third filling portion: an included angle between a sidewall of the third via hole and the bottom surface of the insulating layer is greater than or equal to 85 degrees and less than or equal to 90 degrees.

In a display panel provided in an embodiment of the present disclosure, the third via hole comprises a third opening on a side away from the substrate and a fourth opening on a side close to the substrate;

wherein a ratio of a width of the third opening to a width of the fourth opening is greater than or equal to 0.9 and less than or equal to 1.1.

In a display panel provided in an embodiment of the present disclosure, the semiconductor layer is located between the gate and the substrate, the insulating layer comprises a gate insulating layer disposed between the semiconductor layer and the gate, and an interlayer insulating layer disposed on a side of the gate insulating layer away from the gate:

the third via hole passes through the interlayer insulating layer, the gate insulating layer comprises a first groove in communication with the third via hole, and the second signal line is disposed in the first groove.

In a display panel provided in an embodiment of the present disclosure, the gate is located between the semiconductor layer and the substrate, the insulating layer comprises an interlayer insulating layer disposed between the semiconductor layer and the first metal layer, and a gate insulating layer is disposed on a side of the semiconductor layer away from the interlayer insulating layer:

the third via hole passes through the interlayer insulating layer and the gate insulating layer, the substrate comprises a base and a buffer layer disposed on the base, the buffer layer comprises a fifth open slot penetrating through the buffer layer, wherein the second signal line is disposed in the fifth open slot, and an included angle between a sidewall of the fifth open slot and a bottom surface of the buffer layer is greater than or equal to 85 degrees and less than or equal to 90 degrees.

An embodiment of the present disclosure provides a mobile terminal including a terminal body and a display panel as described above, wherein the terminal body is integrated with the display panel.

Advantageous Effects

An embodiment of the present disclosure provides a display panel including a substrate and a thin film transistor layer disposed on the substrate, the thin film transistor layer comprises a semiconductor layer, an insulating layer, and a first metal layer stacked on the substrate, the insulating layer is disposed on the substrate and the semiconductor layer and covers the semiconductor layer, and the first metal layer is disposed on the insulating layer: the insulating layer comprises at least one via hole, the first metal layer is connected to the semiconductor layer through the via hole, and an included angle between a sidewall of the via hole and a bottom surface of the insulating layer is greater than or equal to 85 degrees and less than or equal to 90 degrees, thereby reducing an area occupied by the via hole on the insulating layer, and improving an aperture rate of the display panel.

DESCRIPTION OF DRAWINGS

The technical solutions and other advantageous effects of the present disclosure will be apparent from the following detailed description of specific embodiments thereof, taken in conjunction with the accompanying drawings.

FIG. 9 is a third cross-sectional view of a display panel according to an embodiment of the present disclosure:

FIG. 10 is a flowchart of a method for manufacturing a display panel according to an embodiment of the present disclosure.

FIG. 12 is a table, that is Table 1, showing a design aperture and an actual aperture of a via hole in a display panel according to an embodiment of the present disclosure; and FIG. 13 is a data table, that is Table 2, showing a design width and an actual width of a source in a display panel according to an embodiment of the present disclosure and a design width and an actual width of a drain in a conventional display panel.

DETAILED DESCRIPTION OF EMBODIMENTS

Figure 1:
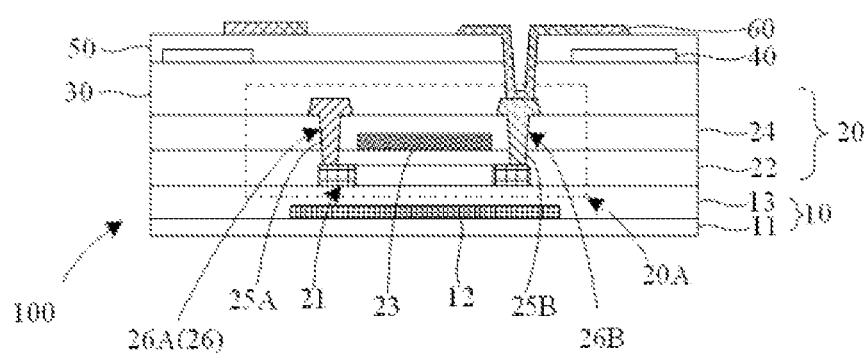
FIG. 1 is a schematic structural diagram of a conventional display panel.

Embodiments of the present disclosure provide a display panel. Each of them will be described in detail below. It should be noted that the order in which the following embodiments are described is not intended to limit the preferred order of the embodiments.

Referring to FIGS. 4 to 11N, an embodiment of the present disclosure provides a display panel, the display panel includes a substrate 10 and a thin film transistor layer 20 disposed on the substrate 10, the thin film transistor layer 20 includes a semiconductor layer 21, an insulating layer 30, and a first metal layer 40 which are stacked on the substrate 10, the insulating layer 30 is disposed on the substrate 10 and the semiconductor layer 21 and covers the semiconductor layer 21, and the first metal layer 40 is disposed on the insulating layer 30;

The insulating layer 30 includes at least one via hole 31, the first metal layer 40 is connected to the semiconductor layer 21 through the via hole 31, and the angle α between the sidewall of the via hole 31 and the bottom surface of the insulating layer 30 is greater than or equal to 85 degrees and less than or equal to 90 degrees.

Referring to FIG. 1, FIG. 1 is a schematic structural diagram of a conventional display panel; it should be noted that the present embodiment does not specifically limit the structure of the conventional display panel, and in the following, only the case where the conventional display panel is a liquid crystal display panel (Liquid Crystal Display, LCD) will be described as an example.

A conventional display panel includes a first substrate 100 and a second substrate (not shown in the figure) arranged oppositely, and a liquid crystal layer (not shown in the figure) disposed between the first substrate 100 and the second substrate, wherein the first substrate 100 is an array substrate including a substrate 10, and a thin film transistor layer 20, a flat layer 30, a common electrode 40, a passivation layer 50, and a pixel electrode 60 sequentially stacked on the substrate 10, the substrate 10 includes a base 11, a light shielding layer 12, and a buffer layer 13 that are stacked, and the thin film transistor layer 20 includes an active layer 21, a gate insulating layer 22, a gate 23, an interlayer insulating layer 24, a source 25A, and a drain 25B sequentially stacked on the substrate 10; wherein the thin film transistor layer 20 includes a plurality of thin film transistors 20A arranged in a matrix, the thin film transistor 20A includes first via hole 26A and second via hole 26B extending through the interlayer insulating layer 24 and the gate insulating layer 22.

Figure 2:
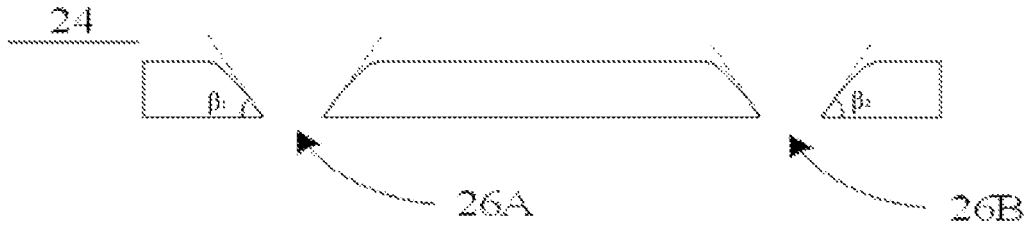
FIG. 2 is a schematic cross-sectional view of an interlayer insulating layer of a conventional display panel.

Currently, in the conventional process of the array substrate, a via hole 26 is formed above the active layer 21 to electrically connect conductive parts located on different film layers. For example, in FIG. 1, the display panel is provided with a first via hole 26A and a second via hole 26B through the interlayer insulating layer 24 and the gate insulating layer 22, the source 25A is connected to the active layer 21 through the first via hole 26A, and the drain 25B is connected to the active layer 21 through the second via hole 26B. However, due to limitations of an exposure apparatus and an etching process, in the conventional process of the array substrate, the taper angle (Taper) of the via hole is smaller. Specifically, referring to FIG. 2, FIG. 2 is a schematic cross-sectional view of an interlayer insulating layer of the conventional display panel. The taper angle β1 of the first via hole 26A is less than 80 degrees, and both sides of the first via hole 26A are arc-shaped. As a result, the area occupied by the first via hole 26A on the interlayer insulating layer 24 is larger, and the area of the metal layer on the first via hole 26A becomes larger: the taper angle β2 of the second via hole 26B is less than 80 degrees, and both sides of the second via hole 26B are arc-shaped. The area occupied by the second via hole 26B on the interlayer insulating layer 24 is relatively larger, as a result, the area of the metal layer located on the second via hole 26B becomes larger, thereby causing the size of the thin film transistor to be relatively larger and being not conducive to the layout of wires in the case of high PPI (pixel density).

The technical solution of the present disclosure will now be described in conjunction with specific embodiments.

Figure 4:
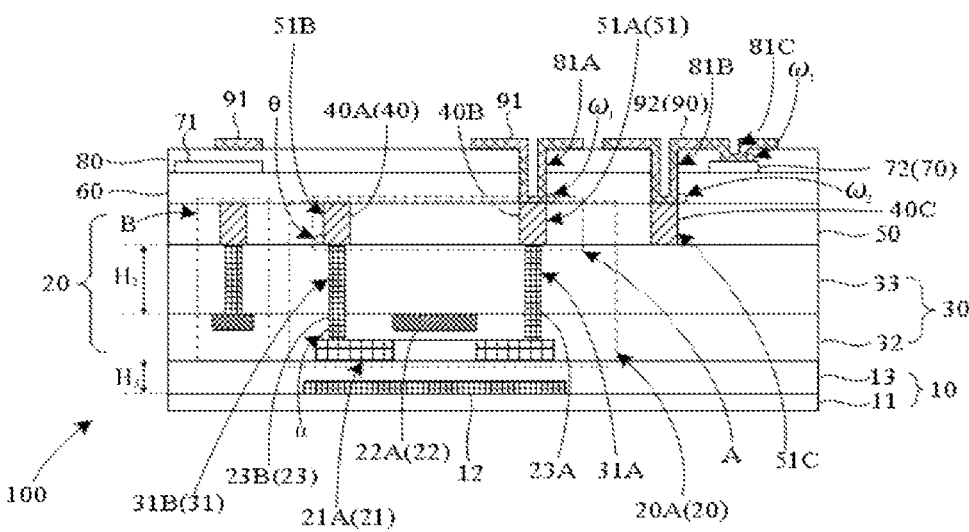
FIG. 4 is a first cross-sectional view of a display panel according to an embodiment of the present disclosure.
Figure 5:
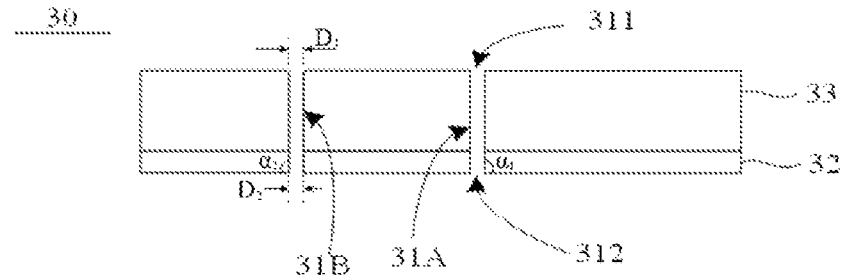
FIG. 5 is a schematic cross-sectional view of an insulating layer according to an embodiment of the present disclosure.
Figure 6:
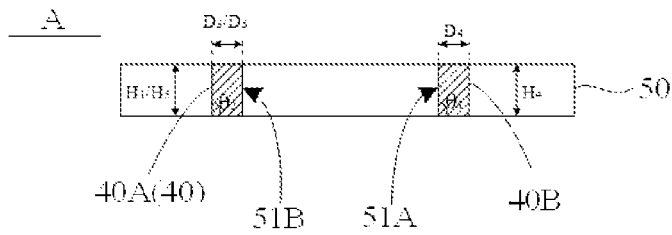
FIG. 6 is an enlarged view at A in FIG. 4.
Figure 7:
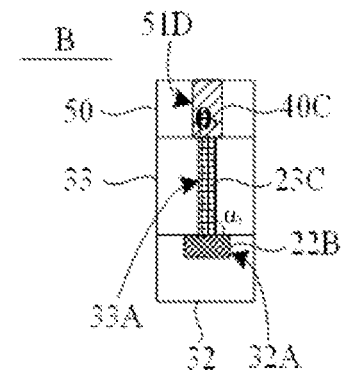
FIG. 7 is an enlarged view at B in FIG. 4.

Referring to FIGS. 4, 5, 6, and 7, FIG. 4 is a first schematic cross-sectional view of a display panel according to an embodiment of the present disclosure; FIG. 5 is a schematic cross-sectional view of an insulating layer according to an embodiment of the present disclosure, FIG. 6 is an enlarged view at A in FIG. 4, and FIG. 7 is an enlarged view at B in FIG. 4.

An embodiment of the present disclosure refers to a display panel including but not limited to one of a Liquid Crystal Display (LCD) and an Organic Light Emitting Diode (OLED) display panel. It should be noted that in this embodiment, the technical solution of the present disclosure is described by taking the display panel as a liquid crystal display panel as an example.

In this embodiment, the display panel includes a first substrate 100 and a second substrate (not shown in the figure) arranged oppositely, and a liquid crystal layer (not shown in the figure) disposed between the first substrate 100 and the second substrate: specifically, in this embodiment, the technical solution of the present disclosure is illustrated by taking the first substrate 100 as an array substrate and the second substrate as a color filter substrate as an example.

In this embodiment, the first substrate 100 includes a substrate 10 and a thin film transistor layer 20 disposed on the substrate 10. The substrate 10 includes a base 11 and a buffer layer 13 disposed on the base 11. The base 11 may include one of a rigid base or a flexible base, which is not specifically limited in this embodiment.

The thin film transistor layer 20 includes a semiconductor layer 21, an insulating layer 30 and a first metal layer 40 stacked on the substrate 10, the insulating layer 30 is disposed on the substrate 10 and the semiconductor layer 21 and covers the semiconductor layer 21, and the first metal layer 40 is disposed on the insulating layer 30: it should be noted that the material of the semiconductor layer 21 includes, but is not limited to, one of polysilicon, amorphous silicon, and oxide. In this embodiment, the technical solution of the present disclosure is illustrated by taking the material of the semiconductor layer 21 as polysilicon as an example.

In this embodiment, the insulating layer 30 includes at least one via hole 31, the first metal layer 40 is connected to the semiconductor layer 21 through the via hole 31, and an included angle α between the sidewall of the via hole 31 and the bottom surface of the insulating layer 30 is greater than or equal to 85 degrees and less than or equal to 90 degrees. It should be noted that the bottom surface of the insulating layer 30 is a side of the insulating layer 30 close to the substrate 10: preferably, the cross section of the sidewall of the via hole 31 is linear in the direction perpendicular to the substrate 10.

In conjunction with FIGS. 2, 5 and 12, FIG. 12 is a table, that is Table 1, showing a design aperture and an actual aperture of a via hole in a display panel according to an embodiment of the present disclosure, and a design aperture and an actual aperture of a via hole in a conventional display panel.

In the conventional display panel, due to the limitation of the exposure apparatus and the etching process, the taper angle of the via hole 26 is generally less than 80 degrees, and both sides of the via hole 26 are arc-shaped. Therefore, as the design aperture of the via hole 26 in the conventional display panel is reduced, the actual aperture of the via hole 26 in the conventional display panel is larger than the design diameter of the via hole 26, and in the this embodiment, by setting the included angle α between the sidewall of the via hole 31 and the bottom surface of the insulating layer 30 to be greater than or equal to 85 degrees and less than or equal to 90 degrees, the via hole 31 further includes a first opening 311 on a side away from the substrate 10, and a second opening 312 on a side close to the substrate 10, and the ratio of the width of the first opening 311 to the width of the second opening 312 is greater than or equal to 0.9 and less than or equal to 1.1, so that the actual aperture of the via hole 31 in the display panel is approximately equal to the design diameter of the via hole 31. Therefore, with the via hole 31 provided in this embodiment, the fabrication of the micro thin film transistor 20A is facilitated.

It should be noted that the via hole 26 in the conventional display panel refers to the via hole in FIG. 1, in which the first via hole 26A and the second via hole 26B are provided through the interlayer insulating layer 24 and the gate insulating layer 22 in the conventional display panel.

In this embodiment, in the direction perpendicular to the substrate 10, a width $D_1$ of the first opening 311 is in a range of 0.2 μm to 3.1 μm, and a width $D_2$ of the second opening 312 is in a range of 0.1 μm to 3 μm, which is not specifically limited in this embodiment. The shape of the first opening 311 and the shape of the second opening 312 are one of a circle, an ellipse, and a rectangle. Further, in this embodiment, the technical solution of the present disclosure is illustrated by taking the shape of the first opening 311 as a circle and the shape of the second opening 312 as a circle as an example.

The technical solution of the present disclosure is illustrated in this embodiment by the fact that the hole depth of the via hole 31 is 2000 nm: it can be seen from Table 1 that, compared with the conventional display panel, under the same hole depth conditions, a depth-to-width ratio (or aspect ratio) of the via hole 31 is positively related to the taper angle of the via hole 31 in the display panel provided by this embodiment.

In this embodiment, the thickness of the insulating layer 30 is greater than twice the thickness of the buffer layer 13. Preferably, the thickness of the insulating layer 30 is in the range of 600 nm to 5000 nm. In this embodiment, by setting the included angle α between the sidewall of the via hole 31 and the bottom surface of the insulating layer 30 to be greater than or equal to 85 degrees and less than or equal to 90 degrees, the actual aperture of the via hole 31 of the display panel is approximately equal to the designed diameter of the via hole 31. Therefore, with the design of the via hole 31 provided in this embodiment, it is beneficial to provide a display panel having the via hole with a high aspect ratio.

Further, in this embodiment, the display panel further includes a conductive filling portion 23 provided in the via hole 31, and the first metal layer 40 is connected to the semiconductor layer 21 through the conductive filling portion 23; specifically, the conductive filling portion 23 is made of a conductive material having a good contact with the semiconductor layer 21 and a low resistivity: preferably, the resistivity of the conductive filling portion 23 is less than $5.48 \times 10^{-6}$ Ω·m, and the material of the conductive filling portion 23 includes but is not limited to at least one of molybdenum (Mo), titanium (Ti), titanium nitride (TiNx), and tungsten (W) or an alloy thereof.

It will be appreciated that in this embodiment, the first metal layer 40 is connected to the semiconductor layer 21 through the conductive filling portion 23 by providing the conductive filling portion 23 in the via hole 31, thereby avoiding the risk of breakage of the first metal layer 40 when the first metal layer 40 is directly connected to the semiconductor layer 21 through the via hole 31 because the hole depth of the via hole 31 is too large: further, in this embodiment, the orthographic projection of the first metal layer 40 on the base 11 covers the orthographic projection of the conductive filling portion 23 on the base 11, thereby increasing the contact area between the first metal layer 40 and the conductive filling portion 23, reducing the contact resistance thereof, and improving the stability of signal transmission.

The display panel further includes a spacing layer 50 located on a side of the insulating layer 30 away from the substrate 10, the spacing layer 50 has a thickness ranging from 500 nm to 2000 nm, and the material of the spacing layer 50 is an inorganic material including, but not limited to, one of single-layer silicon nitride (SiNx), single-layer silicon oxide (SiOx), and single-layer silicon oxynitride (SiON), or a double-layer structure thereof. It is not specifically limited in this embodiment, and it is understood that in this embodiment, In this embodiment, by setting the material of the spacing layer 50 to be an inorganic material, compared with an organic material, the performance is more stable, the insulation is better, and the service life is prolonged.

The spacing layer 50 includes at least one open slot 51 extending through the spacing layer 50, and the open slot 51 is connected to the via hole 31: wherein the first metal layer 40 is disposed in the open slot 51, and an included angle θ between the sidewall of the open slot 51 and the bottom surface of the spacing layer 50 is greater than or equal to 85 degrees and less than or equal to 90 degrees. It should be noted that the bottom surface of the spacing layer 50 is a side of the spacing layer 50 close to the substrate 10: preferably, the cross section of the open slot 51 and the via hole 31 is linear in the direction perpendicular to the substrate 10.

Further, in this embodiment, a ratio of a depth $H_1$ of the open slot 51 to a width $D_3$ of the open slot 51 is 0.2 or more and 1 or less: preferably, the depth $H_1$ of the open slot 51 is in the range of 500 nm to 2000 nm, and the width $D_3$ of the open slot 51 is in the range of 200 nm to 2600 nm, which is not specifically limited in this embodiment.

In this embodiment, the display panel further includes a second metal layer 22: the thin film transistor layer 20 includes a plurality of thin film transistors 20A arranged in a matrix, the first metal layer 40 includes a source 40A and a drain 40B of the thin film transistor 20A, the semiconductor layer 21 includes an active layer 21A of the thin film transistor 20A, and the second metal layer 22 includes a gate 22A of the thin film transistor 20A: the insulating layer 30 includes the plurality of via holes 31 including the first via hole 31A and the second via hole 31B located above the active layer 21A, the conductive filling portion 23 includes a first filling portion 23A disposed in the first via hole 31A and a second filling portion 23B disposed in the second via hole 31B, the drain 40B is connected to the active layer 21A through the first filling portion 23A, and the source 40A is connected to the active layer 21A through the second filling portion 23B.

The included angle $\alpha_1$ between the sidewall of the first via hole 31A and the bottom surface of the gate insulating layer 32 is greater than or equal to 85 degrees and less than or equal to 90 degrees, and the included angle $\alpha_2$ between the sidewall of the second via hole 31B and the bottom surface of the gate insulating layer 32 is greater than or equal to 85 degrees and less than or equal to 90 degrees.

It may be appreciated that in this embodiment, the technical solution of the present disclosure is described by an example, in which the semiconductor layer 21 is disposed between the gate 22A and the substrate 10, and the insulating layer 30 includes the gate insulating layer 32 disposed between the semiconductor layer 21 and the gate 22A, and the interlayer insulating layer 33 disposed at a side of the gate insulating layer 32 away from the gate 22A. Wherein the thickness $H_2$ of the interlayer insulating layer 33 is greater than twice the thickness $H_3$ of the buffer layer 13.

In this embodiment, both the first via hole 31A and the second via hole 31B pass through the interlayer insulating layer 33 and the gate insulating layer 32: the spacing layer 50 includes a plurality of open slots 51 including a third open slot 51A connected to the first via hole 31A and a second open slot 51B connected to the second via hole 31B, wherein the drain 40B is provided in the third open slot 51A, the source 40A is provided in the second open slot 51B, the orthographic projection of the drain 40B on the base 11 covers the orthographic projection of the first filling portion 23A on the base 11, and the orthographic projection of the source 40A on the base 11 covers the orthographic projection of the second filling portion 23B on the base 11, thereby increasing the contact area between the drain 40B and the first filling portion 23A and increasing the contact area between the source 40A and the second filling portion 23B, reducing the contact resistance thereof, and improving the stability of signal transmission.

It may be appreciated that in this embodiment, the first filling portion 23A is provided in the first via hole 31A, the second filling portion 23B is provided in the second via hole 31B, and the drain 40B is provided in the third open slot 51A and is connected to the active layer 21A through the first via hole 31A and the first filling portion 23A, thereby avoiding the risk of breakage when the drain 40B is directly connected to the active layer 21A through the first via hole 31A because the depth of the first via hole 31A is too large: the source 40A is provided in the second open slot 51B and is connected to the active layer 21A through the second via hole 31B and the second filling portion 23B, thereby avoiding a risk of breakage when the source 40A is directly connected to the active layer 21A through the second via hole 31B because the depth of the second via hole 31B is too large.

Further, in this embodiment, an included angle $\theta_1$ between the sidewall of the third open slot 51A and the bottom surface of the spacing layer 50 is greater than or equal to 85 degrees and less than or equal to 90 degrees, and a ratio of a depth $H_4$ of the third open slot 51A to a width $D_4$ of the third open slot 51A is greater than or equal to 0.2 and less than or equal to 1: an included angle $\theta_2$ between the sidewall of the second open slot 51B and the bottom surface of the spacing layer 50 is greater than or equal to 85 degrees and less than or equal to 90 degrees, and a ratio of a depth $H_5$ of the second open slot 51B to a width $D_5$ of the second open slot 51B is greater than or equal to 0.2 and less than or equal to 1.

Figure 3:
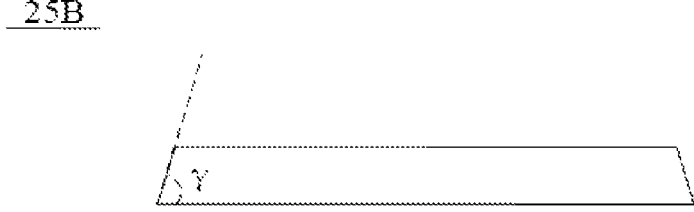
FIG. 3 is a schematic cross-sectional view of a drain of a conventional display panel.

In conjunction with FIG. 3, FIG. 6 and 13, FIG. 3 is a schematic cross-sectional view of a drain of a conventional display panel: FIG. 13 is a data table, that is Table 2, showing the design width and actual width of the source in the display panel according to an embodiment of the present disclosure and the design width and actual width of the drain in the conventional display panel.

It may be appreciated that, in the conventional display panel, the drain 25B is located on a side of the interlayer insulating layer 24 away from the gate insulating layer 22, and a taper angle γ of the drain 25B is generally less than 70 degrees due to the limitation of the exposure apparatus and the etching process. Therefore, as the design width decreases, the actual width of the drain 25B in the conventional display panel is larger than the design width of the drain 25B, resulting in the area of the drain 25B being larger, thereby causing the size of the thin film transistor 20A to be larger; in this embodiment, the included angle θ1 between the sidewall of the third open slot 51A and the bottom surface of the spacing layer 50 is greater than or equal to 85 degrees and less than or equal to 90 degrees, the drain 40B is disposed in the third open slot 51A, and the actual width of the drain 40B may be controlled by designing the width of the third open slot 51A, so that the actual width of the drain 40B of the display panel is approximately equal to the design width of the drain 40B. Therefore, applying the design for the open slot provided in the present embodiment is beneficial to realize the fabrication of the micro thin film transistor.

It should be noted that the drain 25B, the interlayer insulating layer 24, the gate insulating layer 22, and the taper angle $\gamma$ of the drain 25B refers to the drain electrode, the interlayer insulating layer, the gate insulating layer, and the taper angle of the drain electrode of the conventional display panel in FIG. 1.

In this embodiment, the technical solution of the present disclosure is described by taking the case where the thickness of the drain 40B is 1500 nm as an example. As can be seen from Table 2, compared with the conventional display panel, under the same thickness of drain 40B, a depth-to-width ratio (or aspect ratio) of the drain 40B is positively related to the taper angle of the drain 40B in the display panel provided by this embodiment.

In this embodiment, the included angle $\theta 1$ between the sidewall of the third open slot 51A and the bottom surface of the spacing layer 50 is set to be greater than or equal to 85 degrees and less than or equal to 90 degrees, and the ratio of the depth $H_4$ of the third open slot 51A to the width $D_4$ of the third open slot 51A is greater than or equal to 0.2 and less than or equal to 1, so that the actual width of the drain 40B of the display panel is approximately equal to the design width of the drain 40B.

It should be noted that in this embodiment, only the drain 40B in the display panel and the drain 25B in the conventional display panel are used as examples to compare the design of the present disclosure with that of the prior art. The number, size, and position of the open slot 51, and the number, type, and position of the film layers included in the second metal layer 22 are not specifically limited in the present embodiment.

As can be seen from the above embodiment, in this embodiment, by designing the width of the open slot 51, the taper angle of the first metal layer 40 located in the open slot 51 may be controlled, thereby reducing the area of the first metal layer 40. Therefore, with the design for the open slot provided in the present embodiment, it is beneficial to provide a display panel having the metal layer with a high aspect ratio.

In the present embodiment, the display panel further includes a flat layer 60, a second electrode layer 70, a passivation layer 80, and a first electrode layer 90 stacked on the spacing layer 50; a second connection via hole 81A penetrating through the flat layer 60 and the passivation layer 80 is provided in the display panel, and the second connection via hole 81A is connected to the third open slot 51A: the first electrode layer 90 includes a first electrode 91 connected to the drain 40B through the second connection via hole 81A: wherein an included angle $\omega 1$ between the sidewall of the second connection via hole 81A and the bottom surface of the flat layer 60 is greater than or equal to 85 degrees and less than or equal to 90 degrees: it may be appreciated that the embodiment of the present disclosure may reduce the area occupied by the second connection via hole 81A on the passivation layer 80 by setting an included angle $\omega 1$ between the sidewall of the second connection via hole 81A and the bottom surface of the flat layer 60 to be greater than or equal to 85 degrees, and less than or equal to 90 degrees, thereby increasing the aperture rate of the display panel, and meeting the requirements of a high PPI display device.

Further, in the present embodiment, the first electrode 91 covers the sidewall of the second connection via hole 81A and the bottom of the second connection via hole 81A, and the depth of the second connection via hole 81A and the thickness of the first electrode 91 are not specifically limited in the present embodiment.

Specifically, a first connection via hole 81B penetrating through the flat layer 60 and the passivation layer 80, and a third connection via hole 81C penetrating through the passivation layer 80 are provided in the display panel: the plurality of open slots 51 includes a first open slot 51C connected to the first connection via hole 81B, the first connection via hole 81B is connected to the first open slot 51C, the first metal layer 40 includes a first signal line 40C disposed in the first open slot 51C, the second electrode layer 70 includes a touch electrode 72, the first electrode layer 90 includes a bridge section 92, one end of the bridge section 92 is connected to the first signal line 40C through the first connection via hole 81B, and the other end of the bridge section 92 is connected to the touch electrode 72 through the third connection via hole 81C; wherein an included angle $\omega_2$ between the sidewall of the first connection via hole 81B and the bottom surface of the flat layer 60 is greater than or equal to 85 degrees, and less than or equal to 90 degrees, thereby reducing the area occupied by the first connection via hole 81B on the passivation layer 80, and increasing the aperture rate of the display panel: an included angle $\omega_3$ between the sidewall of the third connection via hole 81C and the bottom surface of the passivation layer 80 is greater than or equal to 85 degrees, and less than or equal to 90 degrees, thereby reducing the area occupied by the third connection via hole 81C on the passivation layer 80, increasing the aperture rate of the display panel and meeting the requirements of the high PPI display device.

In the present embodiment, each of the second connection via hole 81A, the first connection via hole 81B, and the third connection via hole 81C includes two openings (not marked in the figure) oppositely disposed, wherein one of the openings is disposed at a side close to the substrate 10, another of the openings is disposed at a side away from the substrate 10, and a ratio of a width of the opening on the side away from the substrate 10 to a width of the opening on the side close to the substrate 10 is greater than or equal to 0.9, and less than or equal to 1.1, so that the actual aperture of the second connection via hole 81A of the display panel is approximately equal to the designed diameter of the second connection via hole 81A, the actual aperture of the first connection via hole 81B of the display panel is approximately equal to the designed diameter of the first connection via hole 81B, and the actual aperture of the third connection via hole 81C of the display panel is approximately equal to the designed diameter of the third connection via hole 81C. Therefore, applying the design for the connection via hole 81 provided in the present embodiment is beneficial to realize that the second connection via hole 81A, the first connection via hole 81B, and the third connection via hole 81C have a high aspect ratio.

It should be noted that, in the present embodiment, the second electrode layer 70 includes the common electrode 71 and the touch electrode 72 spaced apart from each other, and the first electrode layer 90 includes the pixel electrode and the bridge section 92 spaced apart from each other, the pixel electrode is connected to the drain 40B located in the third open slot 51A through the second connection via hole 81A, the first signal line 40C is a touch signal line, and the touch electrode 72 is bridged with the touch signal line through the third connection via hole 81C, the bridge section 92, and the first connection via hole 81B.

When the first signal line 40C is disposed in the first open slot 51C, the taper angle of the first signal line 40C disposed in the first open slot 51C may be controlled by designing the width of the first open slot 51C, thereby reducing the area of the first signal line 40C, reducing wiring difficulties in the display panel, and promoting development of the display panel to a higher PPI.

In the present embodiment, the second metal layer 22 further includes a second signal line 22B spaced apart from the gate 22A, the first metal layer 40 includes a third signal line 40C disposed opposite to the second signal line 22B, the thin film transistor layer 20 includes a third via hole 33A disposed above the second signal line 22B, the conductive filling portion 23 includes a third filling portion 23C disposed in the third via hole 33A, and the plurality of open slots 51 includes a fourth open slot 51D connected to the third via hole 33A: wherein the third signal line 40C is disposed in the fourth open slot 51D and connected to the second signal line 22B through the third filling portion 23C: an included angle as between the sidewall of the third via hole 33A and the bottom surface of the insulating layer 30 is greater than or equal to 85 degrees and less than or equal to 90 degrees: an included angle $\theta_3$ of the sidewall of the fourth open slot 51D and the bottom surface of the spacing layer 50 is greater than or equal to 85 degrees and less than or equal to 90 degrees: further, in the present embodiment, the third via hole 33A passes through the interlayer insulating layer 33, the gate insulating layer 32 includes a first groove 32A connected to the third via hole 33A, and the second signal line 22B is disposed in the first groove 32A.

It may be appreciated that in the present embodiment, the included angle $\alpha_3$ of the sidewall of the third via hole 33A to the bottom surface of the insulating layer 30 is to be greater than or equal to 85 degrees and less than or equal to 90 degrees, further, the third via hole 33A includes a third opening (not marked in the drawing) at a side away from the substrate 10 and a fourth opening (not marked in the drawing) close to a side of the substrate 10, a ratio of the width of the third opening to the width of the fourth opening is greater than or equal to 0.9 and less than or equal to 1.1, so that the actual aperture of the third via hole 33A of the display panel is approximately equal to the designed diameter of the third via hole 33A, and thus, applying the design for the third via hole 33A provided in the present embodiment is beneficial to provide a display panel having the via hole with a high aspect ratio.

Further, in the present embodiment, the third signal line 40C is provided in the fourth open slot 51D, and the included angle $\omega_3$ between the sidewall of the fourth open slot 51D and the bottom surface of the spacing layer 50 is greater than or equal to 85 degrees and less than or equal to 90 degrees, therefore, the taper angle of the third signal line 40C located in the fourth open slot 51D may be controlled by designing the width of the fourth open slot 51D, thereby reducing the area of the third signal line 40C, reducing wiring difficulties in the display panel and promoting the development of the display panel to a higher PPI.

In the present embodiment, the second signal line 22B includes, but is not limited to, a scanning line, and the third signal line 40C includes, but is not limited to, a data line, and the third signal line 40C includes a first signal sub-line (not marked in the drawings) and a second signal sub-line (not marked in the drawings), the first signal sub-line has an extension direction different from the extension direction of the second signal sub-line, the first signal sub-line is provided in the first open slot 51C and is disconnected in the first open slot 51C, and the disconnected first signal sub-line is electrically connected to both ends of the second signal line 22B through the third via hole 33A in a bridged manner, thereby avoiding the short circuit due to connection of the first signal sub-line and the second signal sub-line provided in the same layer.

It should be noted that, in the present embodiment, the gate insulating layer 32 further includes a second groove (not marked in the drawings) in which the gate 22A is disposed, so as to play the role of blocking water, oxygen and insulating for the gate 22A: the substrate 10 further includes a light shielding layer 12 laminated between the base 11 and the buffer layer 13, the orthographic projection of the light shielding layer 12 on the substrate 10 covers the orthographic projection of the active layer 21A on the substrate 10, and the light shielding layer 12 may block light incident on the active layer 21A, thereby reducing an increase in leakage current caused by photo-generated carriers generated by light irradiating on the active layer 21A, and maintaining stability of the display panel in operation.

Figure 8:
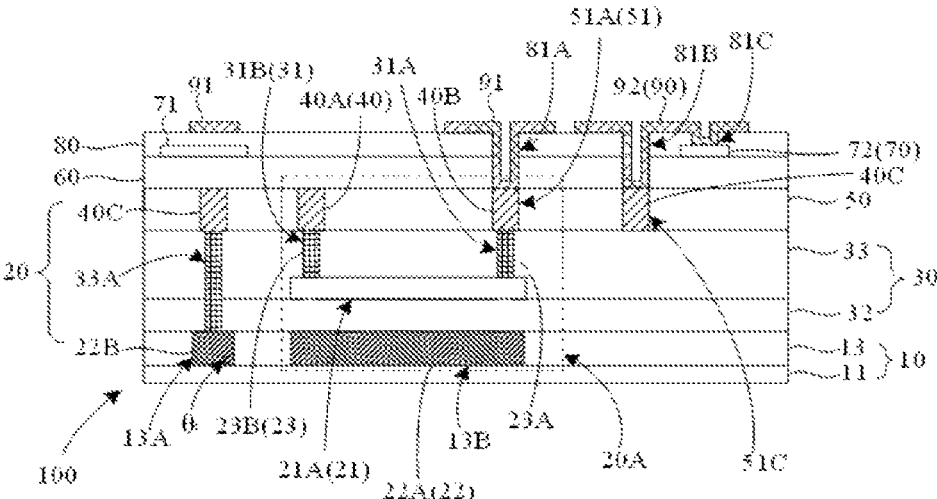
FIG. 8 is a second cross-sectional view of a display panel according to an embodiment of the present disclosure.

In another embodiment, referring to FIG. 8, FIG. 8 is a second cross-sectional view shown a display panel according to an embodiment of the present disclosure.

In the present embodiment, the structure of the display panel is similar/identical to that of the display panel provided in the above first embodiment. For details, please refer to the description of the display panel in the above embodiment, which will not be repeated here. The differences between them are as follows:

In the present embodiment, the material of the semiconductor layer 21 is a metal oxide including, but not limited to, indium gallium zinc oxide (IGZO), indium tin zinc oxide (ITZO), or indium gallium zinc tin oxide (IGZTO): preferably, in the present embodiment, the technical solution of the present application is illustrated by taking the material of the semiconductor layer 21 as indium gallium zinc oxide as an example.

In the present embodiment, the gate 22A is located between the semiconductor layer 21 and the substrate 10, the insulating layer 30 includes the interlayer insulating layer 33 disposed between the semiconductor layer 21 and the first metal layer 40, and a gate insulating layer 32 is disposed at a side of the semiconductor layer 21 away from the interlayer insulating layer 33: in particular, in this embodiment, the technical solution of the present disclosure is described by taking the case where the insulating layer 30 includes an interlayer insulating layer 33 disposed between the semiconductor layer 21 and the first metal layer 40 as an example.

In the present embodiment, both the first via hole 31A and the second via hole 31B pass through the interlayer insulating layer 33: wherein the thickness of the interlayer insulating layer 33 is greater than twice the thickness of the buffer layer 13: preferably, the interlayer insulating layer 33 has a thickness of 600 nm to 5000 nm.

Further, the third via hole 33A passes through the interlayer insulating layer 33 and the gate insulating layer 32, the buffer layer 13 includes a fifth open slot 13A and a sixth open slot 13B penetrating through the buffer layer 13, and the fifth opening 13A is connected to the third via hole 33A: wherein the second signal line 22B is disposed in the fifth open slot 13A, the gate 22A is disposed in the sixth open slot 13B so as to play a role of blocking moisture, oxygen, and insulating for the gate 22A, the included angle between the sidewall of the fifth open slot 13A and the bottom surface of the buffer layer 13 is greater than or equal to 85 degrees and less than or equal to 90 degrees, and the included angle between the sidewall of the sixth open slot 13B and the bottom surface of the buffer layer 13 is greater than or equal to 85 degrees and less than or equal to 90 degrees.

It may be appreciated that, compared with the above-described embodiment, in the present embodiment, the second signal line 22B is disposed in the fifth open slot 13A: since the included angle $\theta_4$ between the sidewall of the fifth open slot 13A and the bottom surface of the buffer layer 13 is greater than or equal to 85 degrees, and less than or equal to 90 degrees, the taper angle of the second signal line 22B located in the fifth open slot 13A may be controlled by designing the width of the fifth open slot 13A, thereby reducing the area of the second signal line 22B, reducing wiring difficulties in the display panel, and promoting the development of the display panel to a higher PPI.

Further, in the present embodiment, the gate 22A is positioned between the base 11 and the active layer 21A, and the orthographic projection of the active layer 21A on the substrate 10 is positioned within the orthographic projection of the gate 22A on the substrate 10, so that the gate 22A functions as the light shielding layer 12 in the above embodiment, thereby saving an engineering process and further reducing the manufacturing cost of the display panel.

In another embodiment, referring to FIG. 9, FIG. 9 is a third cross-sectional view of a display panel according to an embodiment of the present disclosure.

In the present embodiment, the structure of the display panel is similar/identical to that of the display panel provided in the above embodiment. For details, please refer to the description of the display panel in the above embodiment, which will not be repeated here. The differences between them are as follows:

In the present embodiment, the semiconductor layer 21 is an amorphous silicon semiconductor layer 21, the semiconductor layer 21 includes a channel region 210 provided corresponding to the gate 22A, a source contact region 212 and a drain contact region 211 located on both sides of the channel region 210, wherein a portion of the semiconductor layer 21 located in the channel region 210 includes a single crystal silicon layer, and portions of the semiconductor layer 21 located in the source contact region 212 and the drain contact region 211 each include an undoped amorphous silicon layer 21B and an amorphous silicon doped layer 21C stacked on the substrate 10, and the single crystal silicon layer of the channel region 210 is connected to the amorphous silicon doped layers of the source contact region 212 and the drain contact region 211.

In the drain contact region 211, the drain 40B is disposed in the third open slot 51A and connected to the amorphous silicon doped layer through the first via hole 31A and the first filling portion 23A, and in the source contact region 212, the source 40A is disposed in the second open slot 51B and connected to the amorphous silicon doped layer 21C through the second via hole 31B and the second filling portion 23B.

An embodiment of the present disclosure further provides a method for manufacturing a display panel. Referring to FIGS. 4, 10, and 11A to 11N, FIG. 10 is a flowchart of a method for manufacturing a display panel according to an embodiment of the present disclosure: FIGS. 11A to 11N are structural process flow diagrams for manufacturing the display panel in FIG. 10.

In the present embodiment, the manufacturing method of the display panel includes following steps:

Step S100: preparing a substrate 10, including a base 11, and a light shielding layer 12 and a buffer layer 13 sequentially formed on the base 11, as shown in FIG. 11A.

When the base 11 is a rigid base, the material thereof may be metal or glass, and when the base 11 is a flexible base, the material thereof may include at least one of an acrylic resin, a methacrylic resin, a polyisoprene, a vinyl resin, an epoxy resin, a polyurethane-based resin, a cellulose resin, a silicone resin, a polyimide-based resin, and a polyamide-based resin.

The material of the light shielding layer 12 includes, but is not limited to, a metal material, the metal material includes, but not limited to, one or more alloys of molybdenum (Mo), titanium (Ti), and nickel (Ni); the material of the buffer layer 13 includes, but is not limited to, a single-layer silicon nitride ($Si_3N_4$), a single-layer silicon dioxide ($SiO_2$), a single-layer silicon oxynitride ($SiON_x$), or a double-layer structure of the above film layer.

Step S200: forming a thin film transistor layer 20 on the substrate 10, the thin film transistor layer 20 includes a semiconductor layer 21, an insulating layer 30, and a first metal layer 40 stacked on the substrate 10, the insulating layer 30 is disposed on the substrate 10 and the semiconductor layer 21 and covers the semiconductor layer 21, the first metal layer 40 is disposed on the insulating layer 30, wherein the insulating layer 30 includes at least one via hole 31, the first metal layer 40 is connected to the semiconductor layer 21 through the via hole 31, and an included angle $\alpha$ between the sidewall of the via hole 31 and the bottom surface of the insulating layer 30 is greater than or equal to 85 degrees and less than or equal to 90 degrees.

Specifically, in the present embodiment, the step S200 includes the following steps:

Step S201: sequentially forming the semiconductor layer 21, a gate insulating layer 32, a second metal layer 22, and an interlayer insulating layer 33 on the substrate 10, wherein the insulating layer 30 includes the gate insulating layer 32 disposed between the semiconductor layer 21 and a gate 22A, and the interlayer insulating layer 33 disposed on the side of the gate insulating layer 32 away from the gate 22A, and the second metal layer 22 includes the gate 22A disposed corresponding to the semiconductor layer 21, as shown in FIG. 11B.

Specifically, a material of the semiconductor layer 21 includes, but is not limited to, one of polysilicon, amorphous silicon, and an oxide. In this embodiment, an example in which the material of the semiconductor layer 21 is polysilicon is used to describe the technical solution of the present disclosure.

The semiconductor layer 21 includes an active layer 21A between the substrate 10 and the gate insulating layer 32, the active layer 21A includes a first conductor portion and a second conductor portion, and an active section between the first conductor portion and the second conductor portion, and the gate 22A is provided corresponding to the active section.

The material of the gate insulating layer 32 includes, but is not limited to, silicon oxide (SiOx), silicon nitride (SiNx), silicon oxynitride (SiNO), or the like, or a stacked layer thereof, and the gate insulating layer 32 includes a second groove in which the gate 22A is disposed: the interlayer insulating layer 33 has a strong water-oxygen barrier capability and an insulating capability, and materials thereof include, but are not limited to, silicon oxide (SiOx), silicon nitride (SiNx), silicon oxynitride (SiNO), and the like, or a stacked layer thereof, and a thickness of the interlayer insulating layer 33 is greater than twice a thickness of the buffer layer 13: preferably, the interlayer insulating layer 33 has a thickness of 600 nm to 5000 nm.

Figure 11C:
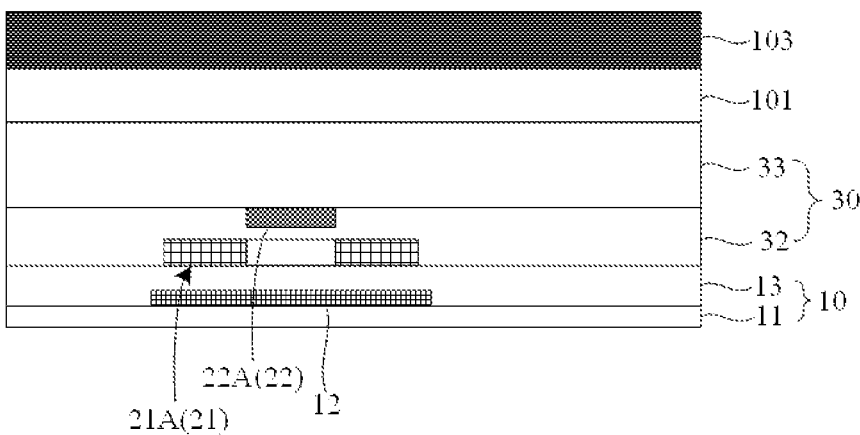
FIGS. 11A to 11N are structural process flow diagrams for manufacturing the display panel in FIG. 10.

Step S202: sequentially forming a first protective layer 101 and a photoresist material 103 on the interlayer insulating layer 33, as shown in FIG. 11C; wherein the material of the first protective layer 101 is an organic material, and the orthographic projection of the first protective layer 101 on the substrate 10 covers the orthographic projection of the interlayer insulating layer 33 on the substrate 10.

Figure 11D:
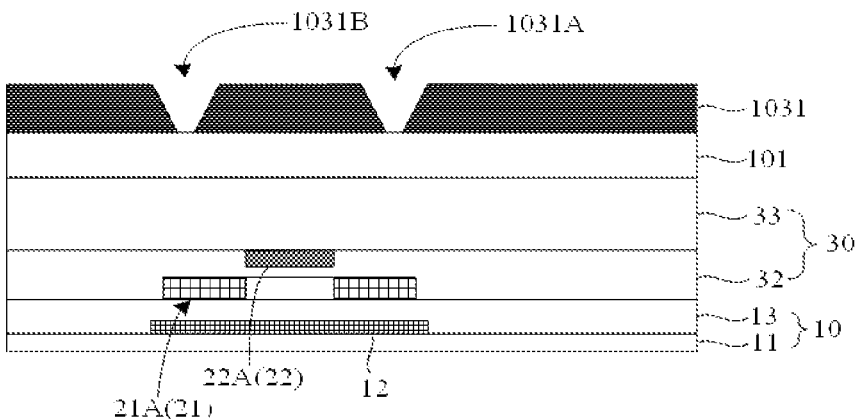

Step S203: exposing and developing the photoresist material 103 with a first mask plate to form a first photoresist layer 1031 disposed above the first protective layer 101, the first photoresist layer 1031 includes a first through hole 1031A disposed corresponding to the first conductor portion and a second through hole 1031B disposed corresponding to the second conductor portion, as shown in FIG. 11D.

In the step S203, a photomasking process is performed on the photoresist material 103 using a mask plate having different transmittance, the mask plate includes a first transmittance region Tr1 and a second transmittance region Tr2, the first transmittance region Tr1 corresponds to the first through hole 1031A and the second through hole 1031B, the transmittance of the first transmittance region Tr1 is 100%, the second transmittance region Tr2 corresponds to the remaining region, and the third transmittance region is opaque to light.

It should be noted that, in the present embodiment, the method of exposing the photoresist material 103 includes but is not limited to using a mask plate having different transmittance: in the present embodiment, a photomasking process of the photoresist material 103 using a mask plate having different transmittance is only used for illustration, which is not limited in this embodiment.

Figure 11E:
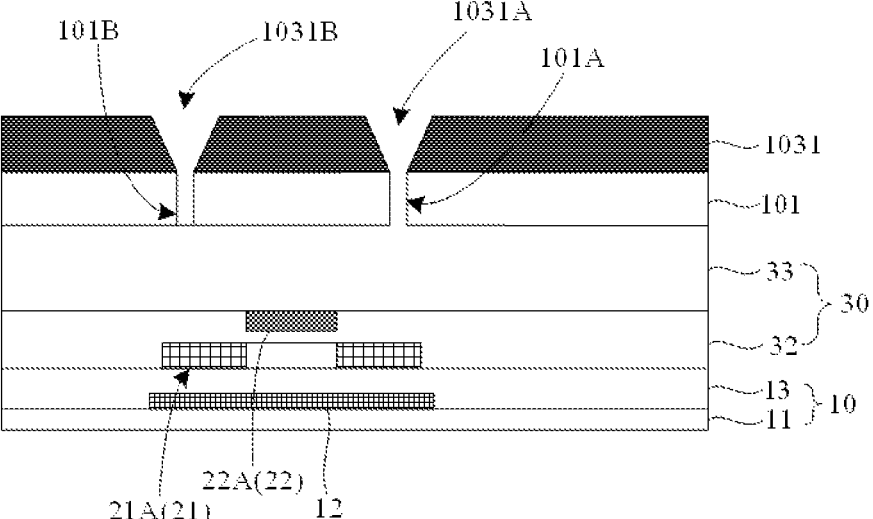

Step S204: etching the first protective layer 101 not covered by the first photoresist layer 1031, and forming a first opening hole 101A and a second opening hole 101B disposed corresponding to the active layer 21A on the first protective layer 101, both the first opening hole 101A and the second opening hole 101B pass through the first protective layer 101, as shown in FIG. 11E.

Step 205: peeling the first photoresist layer 1031.

Step 206: etching the insulating layer 30 with the first protective layer 101 as a second mask plate to form the via holes 31 located above the active layer 21A, wherein the via holes 31 include a first via hole 31A and a second via hole 31B located above the active layer 21A, the first via hole 31A is provided in communication with the first opening hole 101A, the second via hole 31B is provided in communication with the second opening hole 101B, and both the first via hole 31A and the second via hole 31B pass through the interlayer insulating layer 33 and the gate insulating layer 32.

Figure 11F:
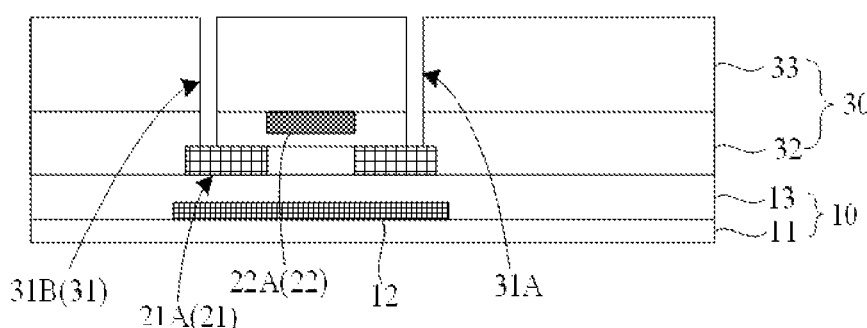

Step 207: peeling the protective layer, as shown in FIG. 11F.

It may be appreciated that in the present embodiment, the first protective layer 101 is formed on the interlayer insulating layer 33, and the interlayer insulating layer 33 and the gate insulating layer 32 are etched by using the first protective layer 101 as a mask plate, so as to form the first via hole 31A provided corresponding to the first opening hole 101A, and the second via hole 31B provided corresponding to the second opening hole 101B, wherein the included angle $\alpha_1$ between the sidewall of the first via hole 31A and the bottom surface of the gate insulating layer 32 is greater than or equal to 85 degrees and less than or equal to 90 degrees, and the included angle $\alpha_2$ between the sidewall of the second via hole 31B and the bottom surface of the gate insulating layer 32 is greater than or equal to 85 degrees and less than or equal to 90 degrees, thereby reducing the area occupied by the via hole 31 on the insulating layer 30, increasing the aperture rate of the display panel, and satisfying the requirement for a high PPI display device. Moreover, in the present embodiment, the first via hole 31A and the second via hole 31B are manufactured simultaneously by only one irradiating process, thereby reducing the manufacturing cost of the display panel.

Further, the via hole 31 includes a first opening 311 on a side away from the substrate 10, and a second opening 312 on a side close to the substrate 10, and a ratio of a width $D_1$ of the first opening 311 to the width $D_2$ of the second opening 312 is greater than or equal to 0.9 and less than or equal to 1.1, so that the actual aperture of the via hole 31 of the display panel is approximately equal to the designed diameter of the via hole 31. Therefore, with the design of the via hole 31 provided in this embodiment, it is beneficial to realize the fabrication of the micro thin film transistor 20A.

Figure 11G:
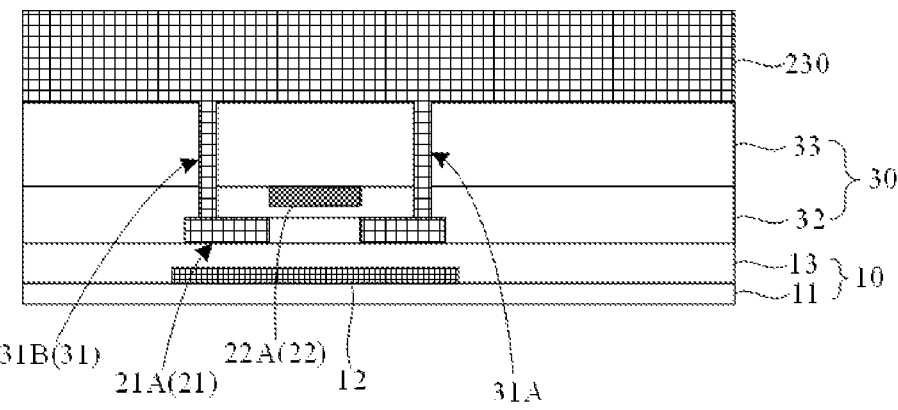

In the present embodiment, the manufacturing method of the display panel further includes the steps of:

Step S300: forming a conductive filling layer 230 on the side of the interlayer insulating layer 33 away from the substrate 10, as shown in FIG. 11G, wherein the conductive filling layer 230 fills the first via hole 31A and the second via hole 31B, the conductive filling layer 230 has a thickness of 500 nm to 5000 nm, and the conductive filling layer 230 is selected from a conductive material having good contact with the semiconductor layer 21 and low resistivity: preferably, the resistivity of the conductive filling layer 230 is less than $5.48 \times 10^{-6}$ $\Omega \cdot m$, and the material of the conductive filling layer 230 includes, but is not limited to, at least one of molybdenum (Mo), titanium (Ti), titanium nitride (TiNx), and tungsten (W), or an alloy thereof, which is not specifically limited in this embodiment.

Figure 11H:
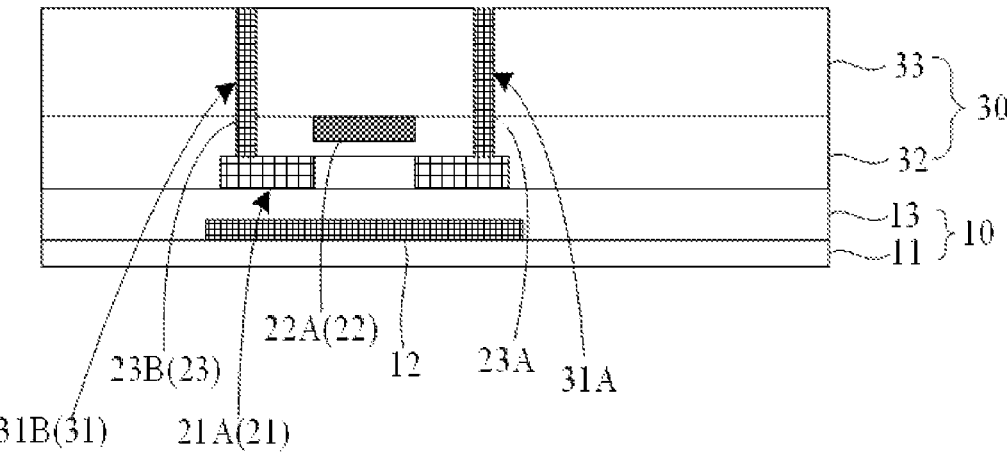

Step S400: patterning the conductive filling layer 230 to form a conductive filling portion 23 including a first filling portion 23A disposed in the first via hole 31A and a second filling portion 23B disposed in the second via hole 31B, as shown in FIG. 11H.

Figure 11I:
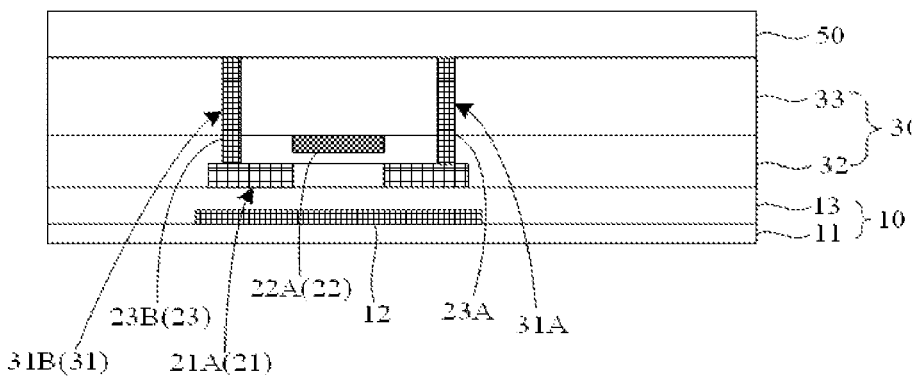

Step S500: forming a spacing layer 50 on a side of the interlayer insulating layer 33 away from the substrate 10, as shown in FIG. 11I, wherein the spacing layer 50 has a thickness in a range of 500 nm to 2000 nm, and the spacing layer 50 is made of an inorganic material including, but not limited to, one of single layer silicon nitride (SiNx), single layer silicon oxide (SiOx), and single layer silicon oxynitride (SiON), or a double-layer structure of above film layers, which is not specifically limited in this embodiment, and it may be understood that the spacing layer 50 is made of an inorganic material, which is more stable in performance, better in insulation, and longer in service life than an organic material.

Step S600: patterning the spacing layer 50 to form at least one open slot 51 penetrating through the spacing layer 50, the open slot 51 is provided in communication with the via hole 31, and an included angle θ between the sidewall of the open slot 51 and the bottom surface of the spacing layer 50 is greater than or equal to 85 degrees and less than or equal to 90 degrees.

Figure 11J:
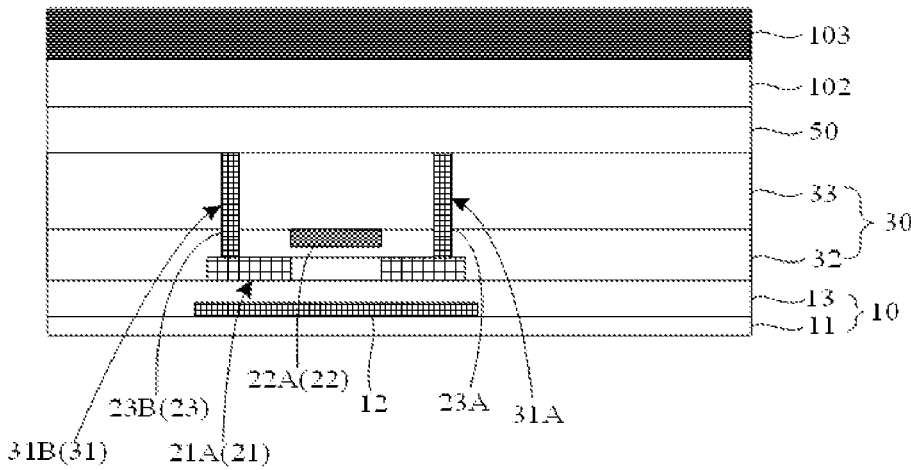

Specifically, in the present embodiment, the step S600 includes the following steps:

Step S601: sequentially forming a second protective layer 102 and a photoresist material 103 on the spacing layer 50, as shown in FIG. 11J: wherein the material of the second protective layer 102 is an organic material, and the orthographic projection of the second protective layer 102 on the substrate 10 covers the orthographic projection of the spacing layer 50 on the substrate 10.

Figure 11K:
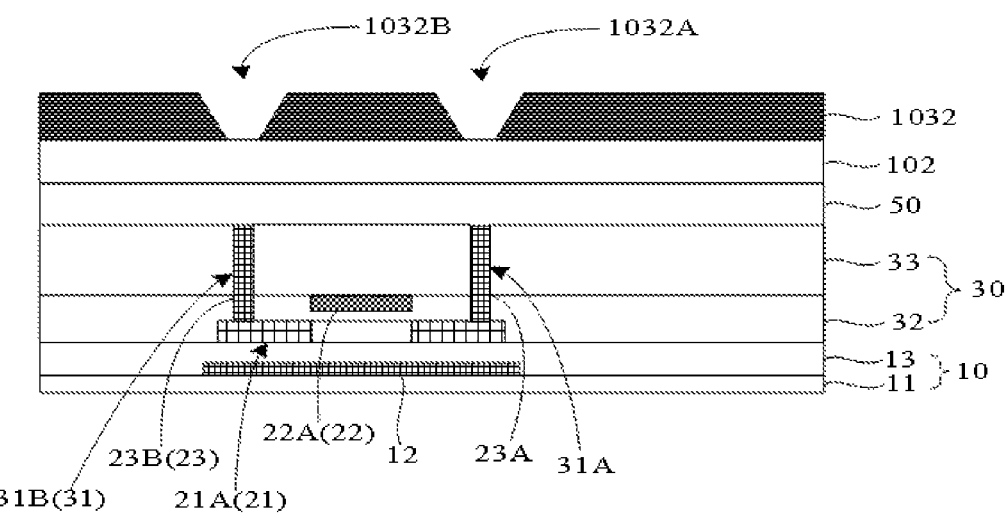

Step S602: exposing and developing the photoresist material 103 with a third mask plate to form a second photoresist layer 1032 disposed above the second protective layer 102, the second photoresist layer 1032 includes a third through hole 1032A disposed corresponding to the first via hole 31A and a fourth through hole 1032B disposed corresponding to the second via hole 31B, as shown in FIG. 11K.

In the step S602, a photomasking process may be performed on the photoresist material 103 using a mask plate having different transmittance, the mask plate includes a first transmittance region Tr1 and a second transmittance region Tr2, the first transmittance region Tr1 corresponds to the third through hole 1032A and the fourth through hole 1032B, the transmittance of the first transmittance region Tr1 is 100%, the second transmittance region Tr2 corresponds to the remaining region, and the third transmittance region is opaque to light.

It should be noted that, in the present embodiment, the method of exposing the photoresist material 103 includes but is not limited to using a mask plate having different transmittance: in the present embodiment, a photomasking process of the photoresist material 103 using a mask plate having different transmittance is only used for illustration, which is not limited in this embodiment.

Figure 11L:
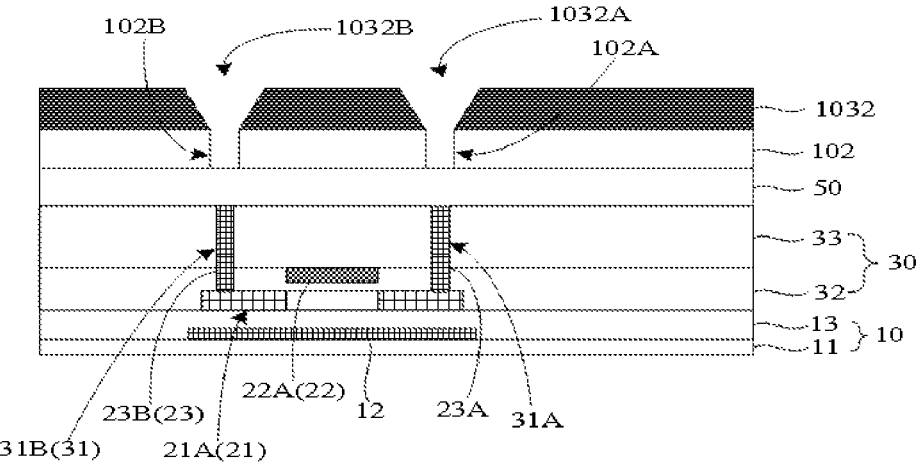

Step S603: etching the second protective layer 102 not covered by the second photoresist layer 1032, and forming a third opening hole 102A corresponding to the third through hole 1032A and a fourth opening hole 102B corresponding to the fourth through hole 1032B in the second protective layer 102, both the third opening hole 102A and the fourth opening hole 102B pass through the second protective layer 102, as shown in FIG. 11L.

Step S604: peeling the second photoresist layer 1032.

Step S605: etching the spacing layer 50 with the second protective layer 102 as a fourth mask plate to form the open slot 51 penetrating through the spacing layer 50, wherein the open slot 51 includes a third open slot 51A provided in correspondence with the third opening hole 102A and a second open slot 51B provided in correspondence with the fourth opening hole 102B: in particular, the third open slot 51A is connected to the first via hole 31A, and the second open slot 51B is connected to the second via hole 31B.

Figure 11M:
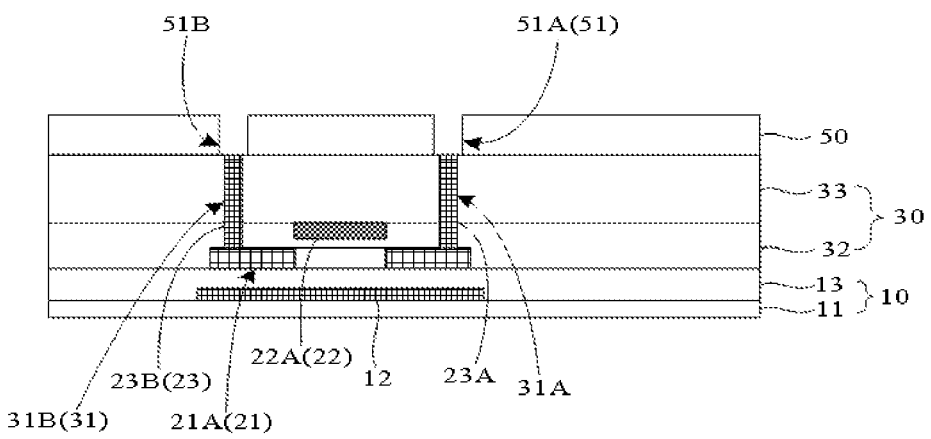
Figure 11N:
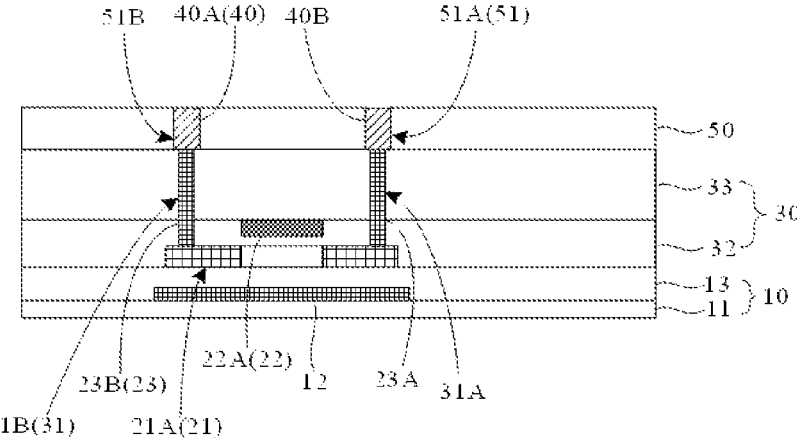

Step S606: peeling the protective layer, as shown in FIG. 11M.

It may be appreciated that in the present embodiment, by forming the second protective layer 102 on the spacing layer 50 and etching the spacing layer 50 with the second protective layer 102 as a mask plate, the third open slot 51A provided corresponding to the third opening hole 102A and the second open slot 51B provided corresponding to the fourth opening hole 102B are formed, wherein the included angle $\theta_1$ between the sidewall of the third open slot 51A and the bottom surface of the spacing layer 50 is greater than or equal to 85 degrees and less than or equal to 90 degrees, and the included angle $\theta_2$ between the sidewall of the second open slot 51B and the bottom surface of the spacing layer 50 is greater than or equal to 85 degrees and less than or equal to 90 degrees.

Step S700: forming the first metal layer 40 on the spacing layer 50, patterning the first metal layer 40 to form a drain 40B located in the third open slot 51A and a source 40A located in the second open slot 51B, as shown in FIG. 11N.

It may be appreciated that in the present embodiment, by setting an included angle $\theta_1$ between the sidewall of the third open slot 51A and the bottom surface of the spacing layer 50 to be greater than or equal to 85 degrees and less than or equal to 90 degrees, the drain 40B is provided in the third open slot 51A, and the actual width of the drain 40B may be controlled by designing the width of the third open slot 51A, so that the actual width of the drain 40B of the display panel is approximately equal to the designed width of the drain 40B, and by setting an included angle $\theta_2$ between the sidewall of the second open slot 51B and the bottom surface of the spacing layer 50, the source 40A is provided in the second open slot 51B, and the actual width of the source 40A may be controlled by designing the width of the second open slot 51B, so that the actual width of the source 40A of the display panel is approximately equal to the designed width of the drain 40B, therefore, applying the design for the open slot 51 provided in the present embodiment is beneficial to realize the fabrication of the micro thin film transistor 20A.

In step S800, a flat layer 60, a second electrode layer 70, a passivation layer 80, and a first electrode layer 90 are sequentially formed on the spacing layer 50 to form the first substrate 100, as shown in FIG. 4.

It may be appreciated that the flat layer 60, the second electrode layer 70, the passivation layer 80, and the first electrode layer 90 have been described in detail in the above-described embodiments, which will be not repeated herein.

Step S900: preparing a second substrate, aligning the second substrate with the first substrate, and injecting liquid crystal between the first substrate and the second substrate.

The present embodiment further provides a mobile terminal including a terminal body and a display panel described in any one of the above embodiments, and the terminal body is integrated with the display panel.

It may be appreciated that the display panel has been described in detail in the above-described embodiments, which will be not repeated herein.

In particular applications, the mobile terminal may be a display screen of devices such as a smartphone, a tablet computer, a notebook computer, a smart wristband, a smart watch, smart glasses, a smart helmet, a desktop computer, a smart television, or a digital camera, or even an electronic device having a flexible display screen.

In the above-mentioned embodiments, the description of each embodiment has its own emphasis, and parts not described in detail in a certain embodiment may be referred to the related description of other embodiments.

In summary, although preferred embodiments have been described above in the present disclosure, the above-mentioned preferred embodiments are not intended to limit the present disclosure. Those of ordinary skilled in the art can make various modifications and changes without departing from the spirit and scope of the present disclosure. Therefore, the protection scope of the present disclosure is subject to the scope defined by the claims.

What is claimed is:

1. A display panel, comprising:
   a substrate;
   a thin film transistor layer disposed on the substrate, wherein the thin film transistor layer comprises a semiconductor layer, an insulating layer, and a first metal layer stacked on the substrate, the insulating layer is disposed on the substrate and the semiconductor layer and covers the semiconductor layer, and the first metal layer is disposed on the insulating layer;

a spacing layer disposed on a side of the insulating layer away from the substrate, wherein the spacing layer comprises at least one open slot penetrating through the spacing layer;

a flat layer, a passivation layer, and a first electrode layer stacked on the spacing layer, wherein a first connection via hole penetrating through the flat layer and the passivation layer is provided in the display panel, the at least one open slot comprises a first open slot in communication with the first connection via hole, the first connection via hole is in communication with the first open slot, the first metal layer comprises a first signal line disposed in the first open slot, the first electrode layer comprises a bridge section, one end of the bridge section is connected with the first signal line through the first connection via hole; and wherein the insulating layer comprises at least one via hole, the first metal layer is connected to the semiconductor layer through the via hole, an included angle between a sidewall of the via hole and a bottom surface of the insulating layer is greater than or equal to 85 degrees and less than or equal to 90 degrees, and an included angle between a sidewall of the first connection via hole and the bottom surface of the flat layer is greater than or equal to 85 degrees and less than or equal to 90 degrees.

2. The display panel according to claim 1, wherein the via hole comprises a first opening on a side away from the substrate and a second opening on a side close to the substrate;

wherein a ratio of a width of the first opening to a width of the second opening is greater than or equal to 0.9 and less than or equal to 1.1.

3. The display panel according to claim 1, wherein the substrate comprises a base and a buffer layer disposed on the base, and a thickness of the insulating layer is greater than twice a thickness of the buffer layer.

4. The display panel according to claim 3, wherein the display panel further comprises a conductive filling portion disposed in the via hole, and the first metal layer is connected to the semiconductor layer through the conductive filling portion.

5. The display panel according to claim 4, wherein a resistivity of the conductive filling portion is less than $5.48 \times 10^{-6}$ $\Omega \cdot m$.

6. The display panel according to claim 4, wherein an orthographic projection of the first metal layer on the base covers an orthographic projection of the conductive filling portion on the base.

7. The display panel according to claim 1, wherein the open slot is provided in communication with the via hole; and wherein the first metal layer is disposed in the open slot, and an included angle between a sidewall of the open slot and a bottom surface of the spacing layer is greater than or equal to 85 degrees and less than or equal to 90 degrees.

8. The display panel according to claim 7, wherein a ratio of a depth of the open slot to a width of the open slot is greater than or equal to 0.2 and less than or equal to 1.

9. The display panel according to claim 7, wherein the display panel further comprises a second metal layer;

the thin film transistor layer comprises a plurality of thin film transistors, the first metal layer comprises a source and a drain of the thin film transistor, the semiconductor layer comprises an active layer of the thin film transistor, and the second metal layer comprises a gate of the thin film transistor;

the insulating layer comprises a plurality of via holes, the plurality of via holes comprise a first via hole and a second via hole located above the active layer, the drain is connected to the active layer through the first via hole, and the source is connected to the active layer through the second via hole.

10. The display panel according to claim 9, wherein the display panel further comprises a conductive filling portion, the conductive filling portion comprises a first filling portion disposed in the first via hole and a second filling portion disposed in the second via hole, the drain is connected to the active layer through the first filling portion, and the source is connected to the active layer through the second filling portion.

11. The display panel according to claim 9, wherein the spacing layer comprises a plurality of open slots, the plurality of open slots comprises a third open slot in communication with the first via hole and a second open slot in communication with the second via hole; and wherein the drain is disposed in the third open slot and the source is disposed in the second open slot.

12. The display panel according to claim 11, wherein the semiconductor layer is located between the gate and the substrate, the insulating layer comprises a gate insulating layer disposed between the semiconductor layer and the gate, and an interlayer insulating layer disposed on a side of the gate insulating layer away from the gate;

both the first via hole and the second via hole pass through the interlayer insulating layer and the gate insulating layer; and wherein the substrate comprises a base and a buffer layer disposed on the base, and a thickness of the interlayer insulating layer is greater than twice a thickness of the buffer layer.

13. The display panel according to claim 11, wherein the gate is located between the semiconductor layer and the substrate, the insulating layer comprises an interlayer insulating layer disposed between the semiconductor layer and the first metal layer, and a gate insulating layer is disposed on a side of the semiconductor layer away from the interlayer insulating layer;

both the first via hole and the second via hole pass through the interlayer insulating layer; and wherein the substrate comprises a base and a buffer layer disposed on the base, and a thickness of the interlayer insulating layer is greater than twice a thickness of the buffer layer.

14. The display panel according to claim 11, wherein the display panel further comprises a second electrode layer stacked on the spacing layer;

a second connection via hole penetrating through the flat layer and the passivation layer is provided in the display panel, and the second connection via hole is communicated with the third open slot;

the first electrode layer comprises a first electrode connected to the drain through the second connection via hole; and wherein an included angle between a sidewall of the second connection via hole and a bottom surface of the flat layer is greater than or equal to 85 degrees and less than or equal to 90 degrees.

15. The display panel according to claim 14, wherein a third connection via hole penetrating through the passivation layer is provided in the display panel;

the plurality of open slots comprise a first open slot in communication with the first connection via hole, the first connection via hole is in communication with the first open slot, the first metal layer comprises a first signal line disposed in the first open slot, the second electrode layer comprises a touch electrode, the first electrode layer comprises a bridge section, one end of the bridge section is connected with the first signal line through the first connection via hole, and another end of the bridge section is connected with the touch electrode through the third connection via hole; and wherein an included angle between a sidewall of the first connection via hole and the bottom surface of the flat layer is greater than or equal to 85 degrees and less than or equal to 90 degrees, and an included angle between a sidewall of the third connection via hole and a bottom surface of the passivation layer is greater than or equal to 85 degrees and less than or equal to 90 degrees.

16. The display panel according to claim 9, wherein the second metal layer further comprises a second signal line spaced apart from the gate, the first metal layer comprises a third signal line disposed opposite to the second signal line, the thin film transistor layer comprises a third via hole located above the second signal line, the conductive filling portion comprises a third filling portion disposed in the third via hole, and the plurality of open slots comprises a fourth open slot in communication with the third via hole;

wherein the third signal line is disposed in the fourth open slot and is connected to the second signal line through the third filling portion; an included angle between a sidewall of the third via hole and the bottom surface of the insulating layer is greater than or equal to 85 degrees and less than or equal to 90 degrees.

17. The display panel according to claim 16, wherein the third via hole comprises a third opening on a side away from the substrate and a fourth opening on a side close to the substrate; and wherein a ratio of a width of the third opening to a width of the fourth opening is greater than or equal to 0.9 and less than or equal to 1.1.

18. The display panel according to claim 16, wherein the semiconductor layer is located between the gate and the substrate, the insulating layer comprises a gate insulating layer disposed between the semiconductor layer and the gate, and an interlayer insulating layer disposed on a side of the gate insulating layer away from the gate; and the third via hole passes through the interlayer insulating layer, the gate insulating layer comprises a first groove in communication with the third via hole, and the second signal line is disposed in the first groove.

19. The display panel according to claim 16, wherein the gate is located between the semiconductor layer and the substrate, the insulating layer comprises an interlayer insulating layer disposed between the semiconductor layer and the first metal layer, and a gate insulating layer is disposed on a side of the semiconductor layer away from the interlayer insulating layer;

the third via hole passes through the interlayer insulating layer and the gate insulating layer, the substrate comprises a base and a buffer layer disposed on the base, the buffer layer comprises a fifth open slot penetrating through the buffer layer, and wherein the second signal line is disposed in the fifth open slot, and an included angle between a sidewall of the fifth open slot and a bottom surface of the buffer layer is greater than or equal to 85 degrees and less than or equal to 90 degrees.

20. A mobile terminal, comprising a terminal body and a display panel, the terminal body being integrated with the display panel, and the display panel comprising:

a substrate;

a thin film transistor layer disposed on the substrate, wherein the thin film transistor layer comprises a semiconductor layer, an insulating layer, and a first metal layer stacked on the substrate, the insulating layer is disposed on the substrate and the semiconductor layer and covers the semiconductor layer, and the first metal layer is disposed on the insulating layer;

a spacing layer disposed on a side of the insulating layer away from the substrate, wherein the spacing layer comprises at least one open slot penetrating through the spacing layer;

a flat layer, a passivation layer, and a first electrode layer stacked on the spacing layer, wherein a first connection via hole penetrating through the flat layer and the passivation layer is provided in the display panel, the at least one open slot comprises a first open slot in communication with the first connection via hole, the first connection via hole is in communication with the first open slot, the first metal layer comprises a first signal line disposed in the first open slot, the first electrode layer comprises a bridge section, one end of the bridge section is connected with the first signal line through the first connection via hole; and wherein the insulating layer comprises at least one via hole, the first metal layer is connected to the semiconductor layer through the via hole, an included angle between a sidewall of the via hole and a bottom surface of the insulating layer is greater than or equal to 85 degrees and less than or equal to 90 degrees, and an included angle between a sidewall of the first connection via hole and the bottom surface of the flat layer is greater than or equal to 85 degrees and less than or equal to 90 degrees.

* * * * *